(12) United States Patent
Iwai et al.

(10) Patent No.: US 8,415,024 B2
(45) Date of Patent: Apr. 9, 2013

(54) PROCESS FOR PRODUCING POLYIMIDE FILM, AND POLYIMIDE FILM

(75) Inventors: Hideki Iwai, Ube (JP); Kazuyuki Hamada, Ube (JP); Yasuhiro Nagoshi, Ube (JP)

(73) Assignee: Ube Industries, Ltd., Ube-shi (JP)

( * ) Notice: Subject to any disclaimer, the term of this patent is extended or adjusted under 35 U.S.C. 154(b) by 0 days.

(21) Appl. No.: 11/911,081

(22) PCT Filed: Apr. 7, 2006

(86) PCT No.: PCT/JP2006/307505
§ 371 (c)(1),
(2), (4) Date: Jan. 28, 2009

(87) PCT Pub. No.: WO2006/109753
PCT Pub. Date: Oct. 19, 2006

(65) Prior Publication Data
US 2009/0297837 A1 Dec. 3, 2009

(30) Foreign Application Priority Data
Apr. 7, 2005 (JP) ................... 2005-110481

(51) Int. Cl.
*B32B 15/00* (2006.01)
*B32B 27/06* (2006.01)
*C08G 69/26* (2006.01)
*B05D 1/00* (2006.01)
*B05D 3/10* (2006.01)
*B05D 3/02* (2006.01)

(52) U.S. Cl.
USPC ........... 428/636; 428/668; 428/458; 528/353; 427/209; 427/336; 427/372.2

(58) Field of Classification Search .................. 428/668, 428/458; 528/353; 427/209, 336, 372.2
See application file for complete search history.

(56) References Cited

U.S. PATENT DOCUMENTS

| | | | |
|---|---|---|---|
| 4,917,959 A * | 4/1990 | Kasanuki | 428/458 |
| 5,130,192 A | 7/1992 | Takabayashi et al. | |
| 5,227,244 A * | 7/1993 | Milligan | 428/458 |
| 6,440,576 B1 * | 8/2002 | Yamamoto et al. | 428/473.5 |
| 2002/0028354 A1 * | 3/2002 | Usuki | 428/694 SL |
| 2006/0048963 A1 * | 3/2006 | Nishinaka et al. | 174/52.2 |
| 2006/0068184 A1 * | 3/2006 | Hamada et al. | 428/220 |
| 2007/0009710 A1 * | 1/2007 | Kurita et al. | 428/141 |

FOREIGN PATENT DOCUMENTS

| | | |
|---|---|---|
| JP | 59-086634 | 5/1984 |
| JP | 62-267330 | 11/1987 |
| JP | 02-134241 | 5/1990 |
| JP | 04-261466 | 9/1992 |

(Continued)

OTHER PUBLICATIONS

International Preliminary Report on Patentability for PCT/JP2006-307505 dated Oct. 18, 2007.

(Continued)

*Primary Examiner* — Kevin R Kruer
(74) *Attorney, Agent, or Firm* — Knobbe Martens Olson & Bear LLP

(57) ABSTRACT

An organic liquid is applied to both sides of a self-supporting film of a polyimide precursor solution, and then the self-supporting film is heated to effect imidization, thereby providing a polyimide film with reduced surface roughness.

22 Claims, 1 Drawing Sheet

FOREIGN PATENT DOCUMENTS

| | | |
|---|---|---|
| JP | 05-025295 | 2/1993 |
| JP | 06-073209 | 3/1994 |
| JP | 06-336533 | 12/1994 |
| JP | 07-273466 | 10/1995 |
| JP | 08-120098 | 5/1996 |
| JP | 08-134234 | 5/1996 |
| JP | 09-003221 | 7/1997 |
| JP | 2000-204178 | 7/2000 |
| JP | 2006-124685 | 5/2006 |
| WO | WO 93/14157 | 7/1993 |
| WO | WO 2004050352 A1 * | 6/2004 |

OTHER PUBLICATIONS

Office Action dated Apr. 13, 2010 in corresponding CN Application No. 200680018463.4.

* cited by examiner

PROCESS FOR PRODUCING POLYIMIDE FILM, AND POLYIMIDE FILM

CROSS-REFERENCE TO RELATED APPLICATIONS

This application claims the benefit and priority to and is a U.S. National Phase of PCT International Application Number PCT/JP2006/307505, filed on Apr. 7, 2006, designating the United States of America, which claims priority under 35 U.S.C. §119 to Japanese Application Number 2005-110481 filed on Apr. 7, 2005. The disclosures of the above-described applications are hereby incorporated by reference in their entirety.

TECHNICAL FIELD

The present invention relates to a process for producing a polyimide film. The present invention also relates to a polyimide film and a copper-clad polyimide film, which are useful as an electric/electronic material, a structural material, a precision-molding material and a heat-controlling material, for example, in a wide range of applications such as electric/electronic device field, semiconductor field, aerospace field and atomic energy field, and are suitable as an insulating film for a COF in particular.

BACKGROUND ART

A polyimide film is widely used in electronic device application because it has excellent thermal properties and electric properties.

Conventionally, a polyimide film may be produced by preparing a self-supporting film of a polyimide precursor solution, and then heating the film to effect imidization. The self-supporting film is prepared by flow-casting and applying a solution of a polyimide precursor on a support such as a stainless substrate and a stainless belt, and then heating it sufficiently to make it self-supporting, which means a stage before a common curing process; specifically, heating it at 100 to 180° C. for about 5 to 60 min.

When a support has a surface flaw, however, it is transferred to a self-supporting film, to form a flaw in the film surface. On the other hand, the opposite side of the film, which is not in contact with the support, tends to have a relatively larger surface roughness. According to the above conventional method, a flawed self-supporting film provides a flawed polyimide film, and a self-supporting film having large surface roughness provides a polyimide film having large surface roughness. There has been needed a process for producing a polyimide film having few surface flaws and reduced surface roughness.

Furthermore, the additional problem is that a laminate having high peel strength cannot be obtained when a metal layer is formed on a polyimide film by metal deposition or sputtering.

There have been various attempts to improve such lower adhesiveness of a polyimide film. For example, there has been proposed a polyimide film with improved adhesiveness, comprising 0.02 to 1% by weight of a tin, bismuth or antimony compound (Patent documents 1, 2 and 3). However, this polyimide film may have deteriorated electric properties such as electric insulation.

There has been proposed a technique for improving adhesiveness of a polyimide film by a plasma discharge treatment (Patent documents 4 and 5). However, such a discharge treatment may be inadequate to improve adhesiveness of a polyimide film, and it is lower in productivity.

Furthermore, there has been proposed a process for producing a polyimide film wherein a heat-resistant surface treatment agent (coupling agent) is applied to the surface of a polyimide film or a solidified film to give a polyimide film (such as the above-mentioned self-supporting film), and then the film is dried by heating, for the purpose of improving adhesiveness of a polyimide film (Patent documents 6-11).

However, it is pointed out that the polyimide film treated with a heat-resistant surface treatment agent may be curled, and trouble may occur during fine wiring processing in a post-processing to a long polyimide film particularly, although it has the treated surface with improved adhesiveness.

As one possible cause of curling, a polyimide film may be curled due to shrinkage of a base material during the removal of a solvent from a polyimide precursor solution, or imidization, for example. As for a multilayer film, it is known that various polyimide precursor varnishes can be flow-casted with a multilayer extruder, for example, while controlling linear expansion coefficients of the surface and of the inside of the polyimide precursor in the thickness direction, to reduce the difference in linear expansion coefficient between the convex surface and the concave surface after curling of the polyimide film, resulting in the effective prevention of curling.

However, in a monolayer film employing a single polyimide precursor varnish, it is difficult to control the curling precisely, although it is suggested that the curling is altered by varying a temperature of removing a solvent in the polyimide precursor and a heating temperature for imidization.

LIST OF REFERENCES

Patent document 1: Japanese Laid-open Patent Publication No. 1992-261466;
Patent document 2: Japanese Laid-open Patent Publication No. 1994-073209;
Patent document 3: Japanese Laid-open Patent Publication No. 1995-503984;
Patent document 4: Japanese Laid-open Patent Publication No. 1984-86634;
Patent document 5: Japanese Laid-open Patent Publication No. 1990-134241;
Patent document 6: Japanese Kokoku Patent Publication No. 1994-002828;
Patent document 7: Japanese Laid-open Patent Publication No. 1994-336533;
Patent document 8: Japanese Laid-open Patent Publication No. 1995-273466;
Patent document 9: Japanese Laid-open Patent Publication No. 1996-120098;
Patent document 10: Japanese Laid-open Patent Publication No. 1996-134234;
Patent document 11: Japanese Laid-open Patent Publication No. 1997-03221.

DISCLOSURE OF THE INVENTION

Problems to be Solved by the Invention

An objective of the present invention is to provide a process for producing a polyimide film having less surface flaws, reduced surface roughness, and improved surface smoothness.

Another objective of the present invention is to provide a process for producing a monolayer polyimide film having excellent adhesiveness, sputtering properties, and metal deposition properties, while maintaining good properties such as thermal, physical and electric properties of an aromatic polyimide film, in which the curling is controlled. A further objective of the present invention is to provide a copper-clad polyimide film comprising a polyimide film produced by the above process.

Means for Solving the Problems

The present invention relates to the followings.

[1] A process for producing a polyimide film, comprising the steps of:
providing a self-supporting film of a polyimide precursor solution;
applying an organic liquid to both sides of the self-supporting film; and
heating the self-supporting film with the applied organic liquid to effect imidization.

[2] The production process as described in [1], wherein a solution of a coupling agent in an organic solvent is applied to one side of the self-supporting film, while an organic liquid without a coupling agent is applied to the other side.

[3] The production process as described in [2], wherein the curling is controlled by adjusting the application amount of the organic liquid without a coupling agent to the side of the self-supporting film.

[4] The production process as described in [1], wherein a solution of a coupling agent in an organic solvent is applied to both sides of the self-supporting film.

[5] The production process as described in [4], wherein the curling is controlled by adjusting the application amount of the organic solvent solution to one side of the self-supporting film.

[6] A polyimide film produced by the process as described in [1].

[7] The polyimide film as described in [6], wherein both sides have an Rms of 3.0 nm or less, an Ra of 2.0 nm or less, and an Rmax of 60 nm or less in a measurement area of 5 μm×5 μm.

[8] A polyimide film produced by the process as described in [3] or [5].

[9] The polyimide film as described in [8], wherein the curling amount measured for a square sample of 10 cm×10 cm of the film is within the range of 0 to −30 mm.

[10] The polyimide film as described in [6], having a thickness of 10 to 38 μm.

[11] A copper-clad polyimide film produced by forming a sputtered metal underlayer and a copper-plated layer on the surface of the polyimide film as described in [8], wherein the surface of the polyimide film is the side to which a solution of a coupling agent in an organic solvent is applied in producing the polyimide film.

[12] The copper-clad polyimide film as described in [11], wherein
the metal underlayer consists of an Ni/Cr alloy layer having a thickness of 1 to 30 nm and a sputtered copper layer having a thickness of 100 to 1000 nm, and
the copper-plated layer has a thickness of 1 to 9 μm.

Effect of the Invention

According to the present invention, an organic liquid is applied to both sides of a self-supporting film of a polyimide precursor solution, and then the self-supporting film is heated to effect imidization, thereby forming a polyimide film. The application of an organic liquid to both sides of a self-supporting film allows the formation of a polyimide film having less surface flaws even when the self-supporting film used has a surface flaw, and the reduction in surface roughness of the polyimide film obtained. Thus, a polyimide film having excellent surface smoothness can be obtained by applying an organic liquid to a self-supporting film surface.

In addition, as described above, when applying a coupling agent to the surface of a self-supporting film for improving adhesiveness of a polyimide film, the polyimide film may be curled, and the precise control of curling is difficult, particularly in a monolayer polyimide film.

In an aspect of the present invention, for improving adhesiveness, a solution of a coupling agent in an organic solvent is applied to one side of a self-supporting film, while an organic liquid is applied to the other side. This organic liquid may be a solution of a coupling agent in an organic solvent. By controlling the application amount of the organic liquid, curling of the polyimide film is controlled. As a result, the present invention can provide a polyimide film having excellent adhesiveness, sputtering properties, and metal deposition properties, while maintaining good properties of an aromatic polyimide film, in which the curling is controlled.

BEST MODE FOR CARRYING OUT THE INVENTION

Figure 1:
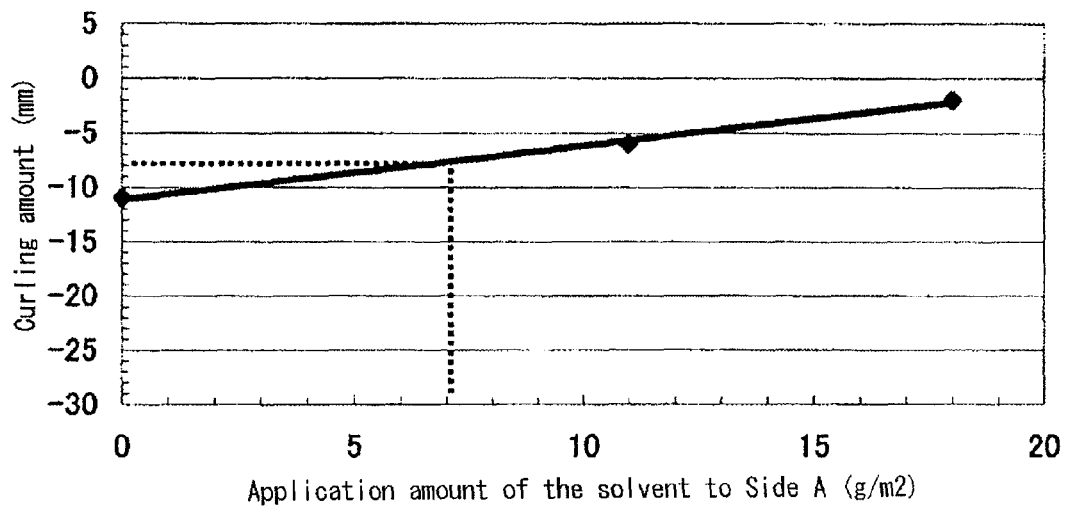
FIG. 1 shows a relationship between the application amount of the solvent and the curling level in Example 1.

According to the present invention, first, a self-supporting film of a polyimide precursor solution is prepared. Next, an organic liquid is applied to both sides of the self-supporting film, and subsequently, the self-supporting film is heated to effect imidization, to form a polyimide film.

A self-supporting film of a polyimide precursor solution may be prepared by flow-casting a solution of a polyimide precursor in an organic solvent to give a polyimide on a support, after adding an imidization catalyst, an organic phosphorous compound and/or an inorganic fine particle to the solution, if necessary, and then heating it sufficiently to make it self-supporting, which means a stage before a common curing process.

A preferable polyimide precursor may be prepared from an aromatic tetracarboxylic acid dianhydride and an aromatic diamine.

Among them, preferred is a polyimide precursor prepared from 3,3',4,4'-biphenyltetracarboxylic acid dianhydride (hereinafter, sometimes abbreviated as "BPDA"), p-phenylenediamine (hereinafter, sometimes abbreviated as "PPD") and optionally 4,4'-diaminodiphenyl ether (hereinafter, sometimes abbreviated as "DADE"). In this case, a ratio of PPD/DADE (molar ratio) is preferably 100/0 to 85/15.

And also, preferred is a polyimide precursor prepared from pyromellitic acid dianhydride (hereinafter, sometimes abbreviated as "PMDA"), or an aromatic tetracarboxylic acid dianhydride consisting of 3,3',4,4'-biphenyltetracarboxylic acid dianhydride and pyromellitic acid dianhydride, and an aromatic diamine such as benzene diamine and biphenyl-diamine. The aromatic diamine may be preferably p-phenylenediamine, an aromatic diamine in which a ratio of PPD/

DADE is 90/10 to 10/90, or tolidine (ortho- and meta-types). In this case, a ratio of BPDA/PMDA is preferably 0/100 to 90/10.

In addition, preferred is a polyimide precursor prepared from pyromellitic acid dianhydride, p-phenylenediamine and 4,4'-diaminodiphenyl ether. In this case, a ratio of DADE/PPD is preferably 90/10 to 10/90.

A polyimide precursor can be synthesized by random-polymerizing or block-polymerizing substantially equimolar mixture of an aromatic tetracarboxylic acid dianhydride and an aromatic diamine in an organic solvent. Alternatively, two or more polyimide precursors in which either of these two components is excessive may be prepared, and subsequently, these polyimide precursor solutions may be combined and then mixed under reaction conditions. The polyimide precursor solution thus obtained may be used without any treatment, or may be used after removing or adding a solvent, if necessary, to prepare a self-supporting film.

Examples of an organic solvent for the polyimide precursor solution include N-methyl-2-pyrrolidone, N,N-dimethylformamide, N,N-dimethylacetamide and N,N-diethylacetamide. These organic solvents may be used alone or in combination of two or more.

The polyimide precursor solution may contain an imidization catalyst, an organic phosphorous-containing compound, an inorganic fine particle, and the like, if necessary.

Examples of the imidization catalyst include substituted or unsubstituted nitrogen-containing heterocyclic compounds, N-oxide compounds of the nitrogen-containing heterocyclic compounds, substituted or unsubstituted amino acid compounds, hydroxyl-containing aromatic hydrocarbon compounds, and aromatic heterocyclic compounds. Particularly suitable examples of the imidization catalyst used are lower-alkylimidazoles such as 1,2-dimethylimidazole, N-methylimidazole, N-benzyl-2-methylimidazole, 2-methylimidazole, 2-ethyl-4-imidazole and 5-methylbenzimidazole; benzimidazoles such as N-benzyl-2-methylimidazole; and substituted pyridines such as isoquinoline, 3,5-dimethylpyridine, 3,4-dimethylpyridine, 2,5-dimethylpyridine, 2,4-dimethylpyridine and 4-n-propylpyridine. The amount of the imidization catalyst used is preferably about 0.01 to 2 equivalents, particularly preferably about 0.02 to 1 equivalents relative to the amount of an amide acid unit in a polyamide acid. The use of the imidization catalyst is preferable because the polyimide film obtained has the improved properties, particularly extension and edge-cracking resistance.

Examples of the organic phosphorous-containing compound include phosphates such as monocaproyl phosphate, monooctyl phosphate, monolauryl phosphate, monomyristyl phosphate, monocetyl phosphate, monostearyl phosphate, triethyleneglycol monotridecyl ether monophosphate, tetraethyleneglycol monolauryl ether monophosphate, diethyleneglycol monostearyl ether monophosphate, dicaproyl phosphate, dioctyl phosphate, dicapryl phosphate, dilauryl phosphate, dimyristyl phosphate, dicetyl phosphate, distearyl phosphate, tetraethyleneglycol mononeopentyl ether diphosphate, triethyleneglycol monotridecyl ether diphosphate, tetraethyleneglycol monolauryl ether diphosphate, and diethyleneglycol monostearyl ether diphosphate; and amine salts of these phosphates. Examples of the amine include ammonia, monomethylamine, monoethylamine, monopropylamine, monobutylamine, dimethylamine, diethylamine, dipropylamine, dibutylamine, trimethylamine, triethylamine, tripropylamine, tributylamine, monoethanolamine, diethanolamine and triethanolamine.

Examples of the inorganic fine particle include particulate inorganic oxide powders such as titanium dioxide powder, silicon dioxide (silica) powder, magnesium oxide powder, aluminum oxide (alumina) powder and zinc oxide powder; particulate inorganic nitride powders such as silicon nitride powder and titanium nitride powder; inorganic carbide powders such as silicon carbide powder; and particulate inorganic salt powders such as calcium carbonate powder, calcium sulfate powder and barium sulfate powder. These inorganic fine particles may be used in combination of two or more. These inorganic fine particles can be homogeneously dispersed using the known means.

A self-supporting film of a polyimide precursor solution is prepared by flow-casting and applying the above-mentioned solution of a polyimide precursor in an organic solvent, or a polyimide precursor solution composition which is prepared by adding an imidization catalyst, an organic phosphorous-containing compound, an inorganic fine particle, and the like to the above solution, on a support, and then heating it to the extent that the film becomes self-supporting, which means a stage before a common curing process, for example, to the extent that the film can be peeled from the support; specifically, heating it at 100 to 180° C. for about 5 to 60 min. The content of the polyimide precursor in the polyimide precursor solution may be preferably about 10 to 30% by weight. The polyimide precursor solution may preferably have a polymer concentration of about 8 to 25% by weight. The support used may be a stainless substrate or a stainless belt, for example.

In the present invention, an organic liquid should be substantially uniformly, preferably uniformly and evenly, applied to both sides of a peeled self-supporting film. Thus, the self-supporting film should be a film to both sides of which an organic liquid can be applied substantially uniformly, preferably uniformly and evenly, and therefore, the heating conditions such as a heating temperature and a heating time should be appropriately selected to give such a film. For preparing such a film, it is necessary to control a solvent contained in the self-supporting film and imidization of the polyimide precursor.

It is preferable that a weight loss on heating is within a range of 20 to 40% by weight, and it is further preferable that a weight loss on heating is within a range of 20 to 40% by weight and an imidization rate is within a range of 8 to 40%, by reason that the self-supporting film obtained has sufficient mechanical properties, an organic liquid is evenly applied to the surface of the self-supporting film more easily, and no foaming, flaws, crazes, cracks and fissures are observed in the polyimide film obtained after imidizing.

The weight loss on heating of a self-supporting film as described above is calculated by the following equation from the weight before drying (W1) and the weight after drying (W2) of the measuring film which is dried at 420° C. for 20 min.

$$\text{Weight loss on heating(\% by weight)} = \{(W1-W2)/W1\}100$$

The imidization rate of a self-supporting film as described above can be determined in accordance with the procedure described in Japanese Laid-open Patent Publication No. 1997-316199, using a Karl Fischer moisture meter. For example, the imidization rate can be calculated based on the ratio of the vibration band peak area measured with IR spectrometer (ATR) between the film and a fully-cured product. The vibration band peak utilized in the procedure may include a symmetric stretching vibration band of an imide carbonyl group and a skeletal stretching vibration band of a benzene ring.

According to the present invention, an organic liquid is applied to both sides of the self-supporting film thus obtained.

By applying an organic liquid to both sides of the self-supporting film, a polyimide film having excellent surface smoothness can be obtained.

There are no particular restrictions to the organic liquid so long as it is a liquid, and those listed as the organic solvent for the polyimide precursor solution may be preferably used. The organic liquid may be a mixture of two or more organic compounds, or a solution.

The application amount of the organic liquid is preferably 1 to 50 g/m$^2$, more preferably 2 to 30 g/m$^2$, particularly preferably 3 to 20 g/m$^2$ for both the side of the self-supporting film which was in contact with the support, and the opposite side. The application amount of the organic liquid to one side may be the same as or different from the application amount of the organic liquid to the other side.

The organic liquid can be applied by any known method; for example, by gravure coating, spin coating, silk screen process, dip coating, spray coating, bar coating, knife coating, roll coating, blade coating, and die coating.

For improving adhesiveness, sputtering properties, and metal deposition properties, it is preferable to apply a solution of a coupling agent in an organic solvent to a self-supporting film. In this case, the application amount of the solution of a coupling agent in an organic solvent is also preferably 1 to 50 g/m$^2$, more preferably 2 to 30 g/m$^2$, particularly preferably 3 to 20 g/m$^2$.

Examples of the coupling agent include silane coupling agents and titanate coupling agents. Examples of the silane coupling agent include epoxy silanes such as γ-glycidoxypropyltrimethoxysilane, γ-glycidoxypropyldiethoxysilane and β-(3,4-epoxycyclohexyl)ethyltrimethoxysilane; vinyl silanes such as vinyltrichlorosilane, vinyltris(β-methoxyethoxy)silane, vinyltriethoxysilane and vinyltrimethoxysilane; acryl silanes such as γ-methacryloxypropyltrimethoxysilane; amino silanes such as N-β-(aminoethyl)-γ-aminopropyltrimethoxysilane, N-β-(aminoethyl)-γ-aminopropylmethyldimethoxysilane, γ-aminopropyltriethoxysilane and N-phenyl-γ-aminopropyltrimethoxysilane; γ-mercaptopropyltrimethoxysilane; and γ-chloropropyltrimethoxysilane. Examples of the titanate coupling agent include isopropyltriisostearoyl titanate, isopropyltridecylbenzenesulfonyl titanate, isopropyltris(dioctylpyrophosphate) titanate, tetraisopropylbis(dioctylphosphite) titanate, tetra(2,2-diallyloxymethyl-1-butyl)bis(di-tridecyl) phosphite titanate, bis(dioctylpyrophosphate)oxyacetate titanate, bis(dioctylpyrophosphate)ethylene titanate, isopropyltrioctanoyl titanate and isopropyltricumylphenyl titanate.

Preferable examples of the coupling agent include silane coupling agents, particularly preferably amino silane coupling agents such as γ-aminopropyl-triethoxysilane, N-β-(aminoethyl)-γ-aminopropyl-triethoxysilane, N-(aminocarbonyl)-γ-aminopropyltriethoxysilane, N-[β-(phenylamino)ethyl]-γ-aminopropyltriethoxysilane, N-phenyl-γ-aminopropyltriethoxysilane and N-phenyl-γ-aminopropyltrimethoxysilane. Among them, N-phenyl-γ-aminopropyltrimethoxysilane is particularly preferable.

Examples of the organic solvent for the coupling agent solution may include those listed as the organic solvent for the polyimide precursor solution (the solvent contained in the self-supporting film).

The content of the coupling agent in the solution of a coupling agent in an organic solvent may be preferably 0.5% by weight or more, more preferably 1 to 100% by weight, particularly preferably 3 to 60% by weight, further preferably 5 to 55% by weight. The water content may be preferably 20% by weight or less, more preferably 10% by weight or less, particularly preferably 5% by weight or less. A solution of a coupling agent in an organic solvent preferably has a rotational viscosity (a solution viscosity measured with a rotation viscometer at a measurement temperature of 25° C.) of 10 to 50,000 centipoise.

A particularly preferable solution of a coupling agent in an organic solvent may be a low-viscosity solution (in particular, a rotational viscosity is 10 to 5,000 centipoise) in which a coupling agent is homogeneously dissolved in an amide solvent with the concentration of 0.5% by weight or more, particularly preferably 1 to 60% by weight, further preferably 3 to 55% by weight.

As described above, when applying a solution of a coupling agent in an organic solvent to the surface of a self-supporting film, adhesiveness of the surface on which the coupling agent is applied may be improved, but the polyimide film may be curled. According to the present invention, a solution of a coupling agent in an organic solvent is applied to one side of a self-supporting film, while an organic liquid without a coupling agent is applied to the other side; or alternatively a solution of a coupling agent in an organic solvent is applied to both sides of a self-supporting film. In this step, the application amount of the organic liquid without a coupling agent is adjusted when applying the solution of a coupling agent in an organic solvent to one side; or the application amount of the solution of a coupling agent in an organic solvent to one side is adjusted when applying the solution to both sides, thereby controlling the curling.

The organic liquid without a coupling agent used in this step may be preferably, but not limited to, the same as the organic solvent in the solution of a coupling agent in an organic solvent.

When applying a solution of a coupling agent in an organic solvent to both sides, it is preferable that the required amount of a coupling agent and the required amount of a solvent for controlling curling are calculated to select the solution amount meeting both requirements.

The application amount of an organic liquid for controlling curling can be determined as follows.

First, to one side of a self-supporting film is applied a solution of a coupling agent in an organic solvent. The application amount is preferably 1 to 50 g/m$^2$. Next, to the other side is applied various amounts of an organic liquid (an organic liquid without a coupling agent, or a solution of a coupling agent in an organic solvent). And then, the film is dried by heating to prepare a polyimide film, for which a curling amount is determined. Thus, the polyimide films are prepared with a constant application amount of the solution of a coupling agent in an organic solvent to one side, and a varied application amount of the organic liquid to the other side, and the curling amounts of these polyimide films are determined to determine a relationship between the application amount of the organic liquid and the curling amount. Specifically, a relationship between the application amount of the organic liquid and the curling amount is plotted on a graph, from which a straight line (or a curve) connecting the plotted points is obtained.

The above sequence of procedure is conducted with varying the thickness of the film or the application amount of the coupling agent, to plot a relationship between the application amount of the organic liquid and the curling amount and obtain a straight line (or a curve) connecting the plotted points.

When determining a relationship among the application amount of the solution of a coupling agent in an organic solvent to one side, the application amount of the organic liquid to the other side, and the curling amount, it is possible to estimate the application amount of the organic liquid to the other side corresponding to the given application amount of the solution of a coupling agent in an organic solvent so as to prepare a polyimide film having a required curling amount. The use of the value allows determination of the application amount of the organic liquid corresponding to the thickness of the film and the application amount of the coupling agent, resulting in obtaining a polyimide film having improved adhesiveness and controlled curling.

It is to be noted that the film surface smoothing effect of the application of an organic liquid is achieved when a solution of a coupling agent in an organic solvent is applied to the surface of a self-supporting film.

According to the present invention, the self-supporting film on both sides of which an organic liquid is applied is then heated to give a polyimide film.

The preferable heat treatment may be a gradual process where polymer imidization and solvent evaporation/removal are conducted at about 100 to 400° C. for about 0.1 to 5 hours, particularly 0.2 to 3 hours as the first step. This heat treatment is particularly preferably conducted stepwise, that is, the first heat treatment at a relatively lower temperature of about 100 to 170° C. for about 1 to 30 min, then the second heat treatment at 170 to 220° C. for about 1 to 30 min, and then the third heat treatment at a high temperature of 220 to 400° C. for about 1 to 30 min. If necessary, the fourth high-temperature heat treatment at 400 to 550° C. may be conducted. Furthermore, in continuous heat treatment at 250° C. or higher, it is preferable that at least both edges of a long solidified film in the direction perpendicular to the direction of the length are fixed with a pintenter, a clip or a frame, for example, while heating.

A polyimide film obtained according to the present invention may have a thickness of about 5 to 125 μm, preferably about 7.5 to 125 μm, more preferably 10 to 100 μm, further preferably 10 to 38 μm.

According to the present invention, a polyimide film with reduced surface roughness can be obtained by applying an organic liquid to both sides of a self-supporting film. Specifically, there may be provided a polyimide film both sides of which have Rms (square mean roughness) of 3.0 nm or less, Ra (arithmetic mean roughness) of 2.0 nm or less, and Rmax (maximum vertical difference) of 60 nm or less in a measurement area of 5 μm×5 μm. Furthermore, there may be provided a polyimide film having Rms of 2.0 nm or less, Ra of 1.5 nm or less, and Rmax of 30 nm or less. Surface roughness of a polyimide film may be determined by atomic force microscope (AFM).

According to an aspect of the present invention, a solution of a coupling agent in an organic solvent is applied to one side of a self-supporting film for improving adhesiveness, and an organic liquid (including a solution of a coupling agent in an organic solvent) is applied to the other side while controlling the application amount, to give a polyimide film in which curling is controlled. For example, there may be provided a long polyimide film in which the curling amount measured for a 10 cm×10 cm square sample is within the range of 0 to −30 mm.

Curling can be determined as follows.

For a polyimide film with a width of less than 550 mm, a 10 cm×10 cm square sample, which is cut from the center of the film, is kept at room temperature, and then placed on a measuring plate such that the convex surface is the underside, and a curling height of each apex raised above the plate (A1, A2, A3, A4) is measured, and an average curling height of the four points is calculated by the following equation.

Curling amount=(A1+A2+A3+A4)/4

For a wide polyimide film (width: about 550 to 2000 mm), three samples are cut from L, C and R (the left end, the center and the right end of the film), and then the measured values for these samples are obtained, and an average of these is calculated as described above.

The curling amount is expressed by a "+" value for curling to the side which correspond to the side of a self-supporting film of a polyimide precursor solution contacting with a support (side B), and by a "−" value for curling to the opposite side (side A).

As described above, a side to which a solution of a coupling agent in an organic solvent is applied has improved adhesiveness, sputtering properties, and metal deposition properties. Therefore, using a polyimide film prepared by applying a solution of a coupling agent in an organic solvent to at least one side of a self-supporting film, on the side to which a coupling agent is applied can be formed a metal layer by a metallizing method, and a metal-plated layer such as a copper-plated layer, to give a metal-clad polyimide film such as a copper-clad polyimide film having sufficiently high peel strength.

A polyimide film, preferably a long polyimide film in which the curling amount measured for a 10 cm×10 cm square sample is within the range of 0 to −30 mm, may be used.

On the surface to which a coupling agent is applied, a metal underlayer can be formed by a metallizing method. The metallizing method is a method for forming a metal layer which is different from metal plating or metal foil lamination, and may include any known method such as vacuum deposition, sputtering, ion plating and electron-beam evaporation.

Examples of a metal used in the metallizing method include, but not limited to, metals such as copper, nickel, chromium, manganese, aluminum, iron, molybdenum, cobalt, tungsten, vanadium, titanium and tantalum, and alloys thereof, oxides thereof, and carbides thereof.

A thickness of a metal layer formed by a metallizing method may be appropriately determined depending on an intended application, and is preferably 1 to 500 nm, more preferably 5 to 200 nm for a practical use.

The number of metal layers formed by a metallizing method may be appropriately determined depending on an intended application, and may be one, two, three or more layers.

On the surface of a metal layer formed by a metallizing method, a metal-plated layer such as a copper-plated layer and a tin-plated layer can be formed by a known wet plating process such as electrolytic plating or nonelectrolytic plating.

A metal-clad polyimide film preferably has a metal-plated layer such as a copper-plated layer with a thickness of 1 to 9 μm for a practical use.

A metal layer formed by a metallizing method may consist of two layers, that is, an Ni/Cr alloy layer having a thickness of 1 to 30 nm and a sputtered copper layer having a thickness of 100 to 1000 nm, for example, and a copper-plated layer having a thickness of 1 to 9 μm may be formed thereon.

EXAMPLES

The following is the examples of the present invention.

The properties of a film other than curling are evaluated as follows.

Linear expansion coefficient (50 to 200° C.): determined by a TMA apparatus (tensile mode; load: 2 g; sample length: 10 mm; 20° C./min) using a sample which was heated at 300° C. for 30 min for stress relaxation in advance.

Tensile modulus: determined in accordance with ASTM-D882 (MD).

Peel strength: 90° peel strength of a copper-clad polyimide film is determined at a pulling speed of 50 mm/min.

Reference Example 1

Into a polymerization tank were placed a given amount of N,N-dimethylacetamide, 3,3',4,4'-biphenyltetracarboxylic acid dianhydride, and p-phenylenediamine in this order. And then, the resulting mixture was polymerized at 30° C. for 10 hours, to give a polyimide precursor solution having a polymer logarithmic viscosity (measurement temperature: 30° C., concentration: 0.5 g/100 mL solvent, solvent: N,N-dimethylacetamide) of 1.60 and a polymer concentration of 18% by weight. To the polyimide precursor solution were added 0.1 parts by weight of monostearyl phosphate triethanolamine salt and 0.5 parts by weight of colloidal silica having an average particle size of 0.08 μm relative to 100 parts by weight of the polyimide precursor, and the resulting mixture was homogeneously mixed to give a polyimide precursor solution composition. The polyimide precursor solution composition had a rotational viscosity of 3000 poise.

Example 1

The polyimide precursor solution composition obtained in Reference Example 1 was continuously casted from a slit of a T-die mold and extruded on a smooth metal support in a drying oven, to form a thin film on the support. The thin film was heated at 120 to 160° C. for 10 min, and then peeled off from the support to give a self-supporting film.

On side B of this self-supporting film was applied a 4 wt % solution of a silane coupling agent (N-phenyl-γ-aminopropyltrimethoxysilane) in N,N-dimethylacetamide at the application amount of 7 g/m², while on side A was applied N,N-dimethylacetamide at the various application amounts. And then, the film was dried under hot air at 80 to 120° C. Subsequently, the dried film was fed into a continuous heating oven while fixing both edges of the film in the width direction, and the film was imidized by heating under the conditions of the highest heating temperature in the oven of about 500° C., to prepare a long polyimide film having an average film thickness of 34 μm and a width of 524 mm continuously.

The curling amounts to each application amount of the solvent (the amount of N,N-dimethylacetamide applied to side A) determined for this polyimide film are as follows.

Application amount of the solvent: 0 g/m², Curling amount: −11 mm;
Application amount of the solvent: 11 g/m², Curling amount: −6 mm;
Application amount of the solvent: 18 g/m², Curling amount: −2 mm.

Based on the results, FIG. 1 shows a relationship between the application amount and the curling amount. According to this graph, the application amount of the solvent required for obtaining a curling amount of −8 mm is 7 g/m².

A long polyimide film having an average film thickness of 34 μm was continuously prepared in the same way as the above process for producing the polyimide film, except that the application amount of the solvent was 7 g/m². The curling amount determined for this polyimide film was −8 mm, indicating that the curling is controlled.

A linear expansion coefficient and a tensile modulus of this polyimide film are as follows.

Tensile modulus (MD): 9307 MPa,
Linear expansion coefficient (MD): 12.6×10⁻⁶ cm/cm/° C.,
Linear expansion coefficient (TD): 13.6×10⁻⁶ cm/cm/° C.

By the conventional method, on this polyimide film were formed an Ni/Cr (weight ratio: 8/2) layer having a thickness of 5 nm and a Cu layer having a thickness of 400 nm as a sputtered metal underlayer, on which copper was plated to a thickness of 8 μm, to give a copper-clad polyimide film. As the measurement result, this copper-clad polyimide film had a 90° peel strength of 0.97 kgf/cm.

Example 2

The polyimide precursor solution composition obtained in Reference Example 1 was continuously casted from a slit of a T-die mold and extruded on a smooth metal support in a drying oven, to form a thin film on the support. The thin film was heated at 120 to 160° C. for 10 min, and then peeled off from the support to give a self-supporting film.

On side A of this self-supporting film was applied a 4 wt % solution of a silane coupling agent (N-phenyl-γ-aminopropyltrimethoxysilane) in N,N-dimethylacetamide at the application amount of 11 g/m², while on side B was applied N,N-dimethylacetamide at the various application amounts. And then, the film was dried under hot air at 80 to 120° C. Subsequently, the dried film was fed into a continuous heating oven while fixing both edges of the film in the width direction, and the film was imidized by heating under the conditions of the highest heating temperature in the oven of about 500° C., to prepare a long polyimide film having an average film thickness of 34 μm and a width of 524 mm continuously.

The curling amounts to each application amount of the solvent (the amount of N,N-dimethylacetamide applied to side B) determined for this polyimide film are as follows.

Application amount of the solvent: 0 g/m², Curling amount: +3 mm;
Application amount of the solvent: 11 g/m², Curling amount: −16 mm;
Application amount of the solvent: 18 g/m², Curling amount: −26 mm.

Figure 2:
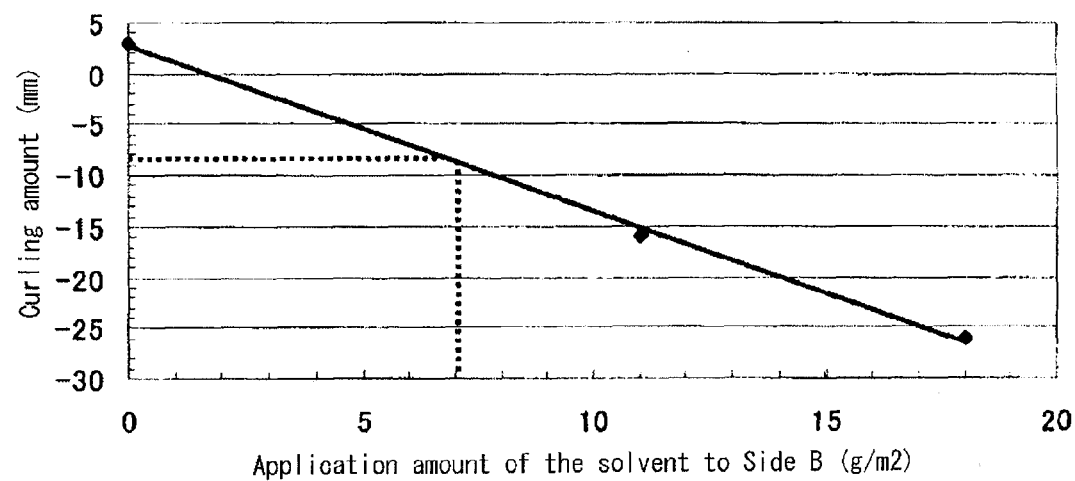
FIG. 2 shows a relationship between the application amount of the solvent and the curling level in Example 2.

Based on the results, FIG. 2 shows a relationship between the application amount and the curling amount. According to this graph, the application amount of the solvent required for obtaining a curling amount of −8 mm is 7 g/m².

A long polyimide film having an average film thickness of 34 μm was continuously prepared in the same way as the above process for producing the polyimide film, except that the application amount of the solvent was 7 g/m². The curling amount determined for this polyimide film was −9 mm, indicating that the curling is controlled.

A linear expansion coefficient and a tensile modulus of this polyimide film are as follows.

Tensile modulus: 9395 MPa,
Linear expansion coefficient (MD): 13.2 ppm/° C.,
Linear expansion coefficient (TD): 14.0 ppm/° C.

By the conventional method, on this polyimide film were formed an Ni/Cr (weight ratio: 8/2) layer having a thickness of 5 nm and a Cu layer having a thickness of 400 nm as a sputtered metal underlayer, on which copper was plated to a thickness of 9 μm, to give a copper-clad polyimide film. As the measurement result, this copper-clad polyimide film had a 90 peel strength of 1.05 kgf/cm.

Example 3

The polyimide precursor solution composition obtained in Reference Example 1 was continuously casted from a slit of a T-die mold and extruded on a smooth metal support in a drying oven, to form a thin film on the support. The thin film was heated at 120 to 160° C. for 10 min, and then peeled off from the support to give a self-supporting film.

On side A (the side which is not in contact with the support) and side B (the side which is in contact with the support) of this self-supporting film was applied a 4 wt % solution of a silane coupling agent (N-phenyl-γ-aminopropyltrimethoxysilane) in N,N-dimethylacetamide at the application amount of 7 g/m². And then, the film was dried under hot air at 80 to 120° C. Subsequently, the dried film was fed into a continuous heating oven while fixing both edges of the film in the width direction, and the film was imidized by heating under the conditions of the highest heating temperature in the oven of about 500° C., to prepare a long polyimide film having an average film thickness of 34 μm and a width of 524 mm continuously.

Surface roughness of this polyimide film was determined by atomic force microscope (AFM) in a measurement area of 5 μm×5 μm. The results are shown in Table 1.

Comparative Example 1

A polyimide film was prepared as described in Example 3, except that a solution of a silane coupling agent in N,N-dimethylacetamide was not applied on side A and side B of the self-supporting film, and its surface roughness was determined. The results are shown in Table 1.

Rms, Ra and Rmax values in Table 1 are given in nm.

TABLE 1

|  |  | Example 3 | Comparative Example 1 |
|---|---|---|---|
| Side A | Rms | 2.54 | 4.21 |
|  | Ra | 1.30 | 1.97 |
|  | Rmax | 53.50 | 101.18 |
| Side B | Rms | 2.63 | 5.09 |
|  | Ra | 1.83 | 3.52 |
|  | Rmax | 26.46 | 108.17 |

The polyimide film of Example 3, which was prepared by applying a solution of a silane coupling agent in N,N-dimethylacetamide on side A and side B of a self-supporting film, has smaller Rms, Ra and Rmax values in both side A and side B and a more smooth film surface than the polyimide film of Comparative Example 1, which was prepared by applying no organic liquid to a self-supporting film.

The invention claimed is:

1. A process for producing a polyimide film, comprising the steps of:
   providing a self-supporting film of a polyimide precursor solution which contains an organic solvent;
   applying an organic liquid without a coupling agent to both sides of the self-supporting film, wherein the organic liquid without a coupling agent is the same as the organic solvent contained in the polyimide precursor solution; and
   heating the self-supporting film with the applied organic liquid to effect imidization.

2. The process as claimed in claim 1, wherein both sides of the polyimide film produced have an Rms of 3.0 nm or less, an Ra of 2.0 nm or less, and an Rmax of 60 nm or less in a measurement area of 5 μm×5 μm.

3. A polyimide film produced by the process as claimed in claim 1.

4. The polyimide film as claimed in claim 3, having a thickness of 10 to 38 μm.

5. A process for producing a polyimide film, comprising the steps of:
   providing a self-supporting film of a polyimide precursor solution which contains an organic solvent;
   applying an organic liquid comprising a coupling agent to both sides of the self-supporting film, wherein the organic liquid comprising a coupling agent is a solution of a coupling agent in the organic solvent which is the same as the organic solvent contained in the polyimide precursor solution; and
   heating the self-supporting film with the applied organic liquid to effect imidization; wherein
   the curling is controlled by adjusting the application amount of the solution of the coupling agent to one side of the self-supporting film.

6. The process as claimed in claim 5, wherein the curling amount measured for a square sample of 10 cm×10 cm of the polyimide film produced is within the range of 0 to −30 mm.

7. A polyimide film produced by the process as claimed in claim 5.

8. The polyimide film as claimed in claim 7, having a thickness of 10 to 38 μm.

9. A copper-clad polyimide film produced by forming a sputtered metal underlayer and a copper-plated layer on the surface of the polyimide film as claimed in claim 7.

10. The copper-clad polyimide film as claimed in claim 9, wherein the metal underlayer consists of an Ni/Cr alloy layer having a thickness of 1 to 30 nm and a sputtered copper layer having a thickness of 100 to 1000 nm, and the copper-plated layer has a thickness of 1 to 9 μm.

11. A process for producing a polyimide film, comprising the steps of:
   providing a self-supporting film of a polyimide precursor solution which contains an organic solvent;
   applying an organic liquid without a coupling agent to one side of the self-supporting film, wherein the organic liquid without a coupling agent is the same as the organic solvent contained in the polyimide precursor solution, and applying an organic liquid comprising a coupling agent to the other side, wherein the organic liquid comprising a coupling agent is a solution of a coupling agent in the organic solvent which is the same as the organic solvent contained in the polyimide precursor solution; and
   heating the self-supporting film with the applied organic liquid to effect imidization.

12. The process as claimed in claim 11, wherein both sides of the polyimide film produced have an Rms of 3.0 nm or less, an Ra of 2.0 nm or less, and an Rmax of 60 nm or less in a measurement area of 5 μm×5 μm.

13. A polyimide film produced by the process as claimed in claim 11.

14. The polyimide film as claimed in claim 13, having a thickness of 10 to 38 μm.

15. A copper-clad polyimide film produced by forming a sputtered metal underlayer and a copper-plated layer on the surface of the polyimide film as claimed in claim 13, wherein the surface of the polyimide film is the side to which the organic liquid comprising the coupling agent is applied in producing the polyimide film.

16. The copper-clad polyimide film as claimed in claim 15, wherein the metal underlayer consists of an Ni/Cr alloy layer having a thickness of 1 to 30 nm and a sputtered copper layer having a thickness of 100 to 1000 nm, and the copper-plated layer has a thickness of 1 to 9 μm.

17. A process for producing a polyimide film, comprising the steps of:

providing a self-supporting film of a polyimide precursor solution which contains an organic solvent;

applying an organic liquid without a coupling agent to one side of the self-supporting film, wherein the organic liquid without a coupling agent is the same as the organic solvent contained in the polyimide precursor solution, and applying an organic liquid comprising a coupling agent to the other side, wherein the organic liquid comprising a coupling agent is a solution of a coupling agent in the organic solvent which is the same as the organic solvent contained in the polyimide precursor solution; and heating the self-supporting film with the applied organic liquid to effect imidization; wherein the curling is controlled by adjusting the application amount of the organic liquid without a coupling agent to the side of the self-supporting film.

18. The process as claimed in claim 17, wherein the curling amount measured for a square sample of 10 cm×10 cm of the polyimide film produced is within the range of 0 to −30 mm.

19. A polyimide film produced by the process as claimed in claim 17.

20. The polyimide film as claimed in claim 19, having a thickness of 10 to 38 μm.

21. A copper-clad polyimide film produced by forming a sputtered metal underlayer and a copper-plated layer on the surface of the polyimide film as claimed in claim 19, wherein the surface of the polyimide film is the side to which the organic liquid comprising the coupling agent is applied in producing the polyimide film.

22. The copper-clad polyimide film as claimed in claim 21, wherein the metal underlayer consists of an Ni/Cr alloy layer having a thickness of 1 to 30 nm and a sputtered copper layer having a thickness of 100 to 1000 nm, and the copper-plated layer has a thickness of 1 to 9 μm.

\* \* \* \* \*

UNITED STATES PATENT AND TRADEMARK OFFICE
CERTIFICATE OF CORRECTION

PATENT NO.       : 8,415,024 B2                                          Page 1 of 1
APPLICATION NO. : 11/911081
DATED            : April 9, 2013
INVENTOR(S)      : Iwai et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1277 days.

Signed and Sealed this
First Day of September, 2015

Michelle K. Lee
*Director of the United States Patent and Trademark Office*